(12) United States Patent
Hwang et al.

(10) Patent No.: US 7,998,843 B2
(45) Date of Patent: Aug. 16, 2011

(54) METHOD OF FORMING AMORPHOUS SILICON LAYER AND METHOD OF FABRICATING LCD USING THE SAME

(75) Inventors: Tae-Hyung Hwang, Seoul (KR); Hyung-Il Jeon, Incheon (KR); Seok-Joon Hong, Seoul (KR)

(73) Assignee: Samsung Electronics Co., Ltd. (KR)

( * ) Notice: Subject to any disclaimer, the term of this patent is extended or adjusted under 35 U.S.C. 154(b) by 168 days.

(21) Appl. No.: 12/398,978

(22) Filed: Mar. 5, 2009

(65) Prior Publication Data
US 2010/0075449 A1 Mar. 25, 2010

(30) Foreign Application Priority Data
Sep. 23, 2008 (KR) .............................. 2008-0093370

(51) Int. Cl.
*H01L 21/00* (2006.01)
(52) U.S. Cl. ........................ 438/485; 438/482; 257/57
(58) Field of Classification Search .................. 438/482, 438/485; 257/57
See application file for complete search history.

(56) References Cited

U.S. PATENT DOCUMENTS

| 4,631,198 A | * | 12/1986 | Kakinuma et al. | 427/574 |
| 5,093,703 A | * | 3/1992 | Minami et al. | 257/57 |
| 5,796,121 A | | 8/1998 | Gates | |
| 6,352,910 B1 | * | 3/2002 | Harshbarger et al. | 438/482 |
| 6,391,690 B2 | * | 5/2002 | Miyasaka | 438/149 |
| 7,598,159 B2 | * | 10/2009 | Oh et al. | 438/482 |
| 7,655,542 B2 | * | 2/2010 | Choi et al. | 438/478 |
| 2010/0003780 A1 | * | 1/2010 | Choi et al. | 438/97 |

FOREIGN PATENT DOCUMENTS

| JP | 2005-93986 | 4/2005 |
| KR | 10-2005-0053356 | 6/2005 |
| KR | 10-2005-0054788 | 6/2005 |

* cited by examiner

*Primary Examiner* — Jarrett J Stark
*Assistant Examiner* — Nicholas Tobergte
(74) *Attorney, Agent, or Firm* — Innovation Counsel LLP

(57) ABSTRACT

Methods and systems for forming an amorphous silicon layer are disclosed for one or more embodiments. For example, a substrate may be provided, and an amorphous silicon layer, in which a ratio of Si—H to Si—$H_2$ has a value equal to or less than 4 to 1, may be formed on the substrate using chemical vapor deposition equipment.

18 Claims, 11 Drawing Sheets

METHOD OF FORMING AMORPHOUS SILICON LAYER AND METHOD OF FABRICATING LCD USING THE SAME

CROSS-REFERENCE TO RELATED APPLICATION

This application claims priority to and benefit of Korean Patent Application No. 2008-93370, filed Sep. 23, 2008, the contents of which are hereby incorporated by reference in their entirety.

BACKGROUND

1. Technical Field

The present invention relates generally to a method of forming an amorphous silicon layer and a method of fabricating an LCD (liquid crystal display) using the same. More particularly, the present invention relates to a method of forming an amorphous silicon layer which, for example, may use PECVD (plasma enhanced chemical vapor deposition) equipment at a low temperature.

2. Related Art

Recently, technologies related to displays, such as computer monitors, have become important. In this regard, LCDs have been spotlighted as displays that are capable of providing images with natural colors.

Generally, LCDs are not flexible, so applications for LCDs are limited to those applications wherein the use of rigid LCDs is acceptable. Studies regarding the replacement of a rigid substrate for a flat panel display device with a flexible plastic (non-glass) substrate have been conducted.

The LCD requires an amorphous silicon thin film transistor to drive the liquid crystals thereof. In order to form the amorphous silicon thin film transistor, a high temperature process is necessary to deposit the amorphous silicon layer. However, since the flexible substrate, such as a plastic substrate, has low thermal resistance as compared with a conventional glass substrate, the amorphous silicon layer must be deposited at a low temperature. In this regard, studies have been conducted to improve a conventional deposition process.

However, when using an amorphous silicon thin film transistor fabricated using the conventional deposition process, defect density becomes high because the amorphous silicon thin film transistor is formed at the low temperature, so that charge trap may occur in a semiconductor layer. Thus, such ASG (amorphous silicon gate) type LCDs may not be reliably driven.

SUMMARY

An embodiment of the present invention provides a method of forming an amorphous silicon layer, which for example may have superior thin film transistor properties at low temperatures.

According to an embodiment of the present invention, a method comprises providing a substrate and forming an amorphous silicon layer, in which a ratio of Si—H bonding to Si—$H_2$ bonding has a value equal to or less than about 4 to 1 and equal to or greater than about 1.2 to 1. For example, the ratio may be equal to or less than about 3.6 to 1. The amorphous silicon layer may be formed on the substrate using chemical vapor deposition equipment.

According to an embodiment, the chemical vapor deposition equipment include a chamber. In the chamber, first and second electrodes are disposed facing each other, and a gas supply unit supplies $SiH_4$ and $H_2$. Power is applied to the first and second electrodes. Particularly, radio frequency power is applied to the first electrode.

According to an embodiment, the process conditions for forming the amorphous silicon layer are as follows. Pressure of the chamber is about 1.6 Torr to about 3.5 Torr, for example, about 2.5 Torr. $SiH_4$ to $H_2$ gases are supplied to the gas supply unit, such as at a ratio of about 1% by volume to about 4% by volume, for example, about 3% by volume (volume percent or vol. %). The radio frequency power is about 150 W to about 500 W, for example, about 150 W. A distance between the first and second electrodes is about 1.3 cm to about 2.5 cm, for example, about 2.0 cm. Temperature of the chamber is about 100° C. to about 180° C., for example, about 130° C.

Since a chemical vapor deposition (CVD) method is performed at low temperature, as described above, the CVD method is suitable when the amorphous silicon layer is formed on a flexible substrate such as a plastic substrate. The flexible substrate may include a fiber reinforced plastic substrate or a polyethersulfone substrate.

According to an embodiment, a method of fabricating a liquid crystal display using the amorphous silicon layer is provided.

According to an embodiment, first and second substrates facing each other are provided. An amorphous silicon layer, in which a ratio of Si—H to Si—$H_2$ has a value equal to or less than 4 to 1, is formed on the substrate. A thin film transistor substrate including the amorphous silicon layer as a semiconductor layer is fabricated.

An opposite substrate is aligned to face the thin film transistor substrate fabricated according to the above method, and a liquid crystal layer is formed between the first and second substrates to complete fabrication of an LCD.

According to the conventional chemical vapor deposition method, since the process temperature is very high, for example about 370° C., the CVD method can be applied to a substrate having high thermal resistance, such as a glass or quartz substrate. On the contrary, the CVD method can not be applied to a substrate having low thermal resistance such as a plastic substrate. In addition, in the conventional CVD process conditions, as only the temperature is lowered, the quality of a layer is degraded. Therefore, even though a thin film transistor is formed, the thin film transistor cannot serve properly as a transistor due to a very low value (0.001 µA) of on current $I_{on}$ thereof. Particularly, even if the process conditions are partially changed, charge trap may occur because a layer is formed at the low temperature, so that the reliability of the thin film transistor is degraded, e.g. $V_{th}$ shift is high.

However, according to an embodiment of the present invention, a high quality amorphous silicon layer having high reliability can be formed at a low temperature of about 100° C. to about 180° C. Further, the amorphous silicon layer can be formed on a flexible substrate such as a plastic substrate, so that a high quality flexible LCD can be fabricated.

BRIEF DESCRIPTION OF THE DRAWINGS

The above and other advantages of embodiments of the present invention will become readily apparent by reference to the following detailed description when considered in conjunction with the accompanying drawings wherein.

DETAILED DESCRIPTION

Figure 1:
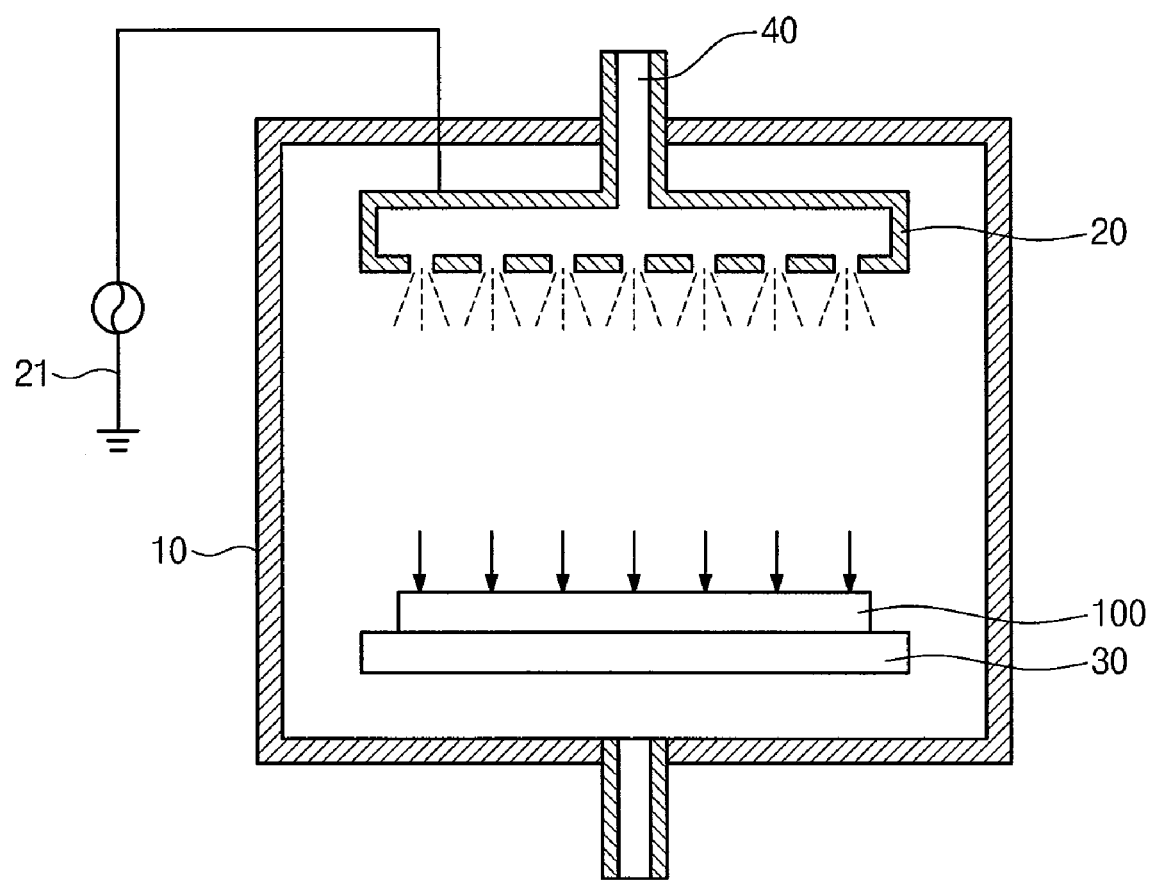
FIG. 1 is a sectional view illustrating PECVD equipment according to an embodiment of the present invention.

Hereinafter, embodiments of a display apparatus will be explained in detail with reference to the accompanying drawings.

It should be understood that the present invention is not limited to appended drawings but includes all modifications, equivalents and alternatives within the spirit and scope of the present invention as defined in the following claims.

The appended drawings are not necessarily to scale, presenting a somewhat extended or reduced representation of partial elements to illustrate various layers and regions more clearly. In the figures, reference numerals refer to the same or equivalent parts of the present invention throughout the figures of the drawing. As used herein, the expression, "one layer (film) is formed (disposed) 'on' another layer (film)" includes not only a case where the two layers (films) are in contact with each other but also a case where an additional layer (film) is present between the two layers (film).

In a method of forming amorphous silicon according to an examplary embodiment of the present invention, a substrate is prepared, and an amorphous silicon layer is formed on the substrate using a PECVD process.

The substrate includes transparent insulating material such as glass or quartz. The material such as glass or quartz can be subject to a relatively high temperature process as compared with plastic, but application fields of the material are limited due to lack of flexibility. In this regard, research into a flexible substrate has been conducted. A plastic substrate is a representative flexible substrate. Particularly, a polyethersulfone substrate and a fiber reinforced plastic substrate of the plastic substrate may be used in a exemplary embodiment of the present invention as the flexible substrate due to low temperature expansion coefficient and low birefringence thereof.

The amorphous silicon layer may be formed on the prepared substrate using the PECVD process.

FIG. 1 is a sectional view illustrating PECVD equipment according to an embodiment of the present invention.

As illustrated in FIG. 1, the PECVD equipment according to an embodiment of the present invention includes a chamber 10, first and second electrodes 20 and 30, and a gas supply unit 40. The first and second electrodes 20 and 30 are disposed in the chamber 10. The first and second electrodes face each other. The gas supply unit 40 supplies gases of $SiH_4$ and $H_2$ to the chamber 10. The PECVD equipment includes a power supply 21 that supplies power to the first and second electrodes 20 and 30. Particularly, radio frequency power is applied to the first electrode 20 to form plasma. A substrate 100 is loaded on the second electrode 30 to allow an amorphous silicon layer to be formed thereon.

The amorphous silicon layer is formed on the prepared substrate using the PECVD equipment. First, the substrate 100 is loaded on the second electrode 30 in the chamber 10.

Next, the gases $SiH_4$ and $H_2$ are supplied to the chamber 10 through the gas supply unit 40 while the radio frequency power is being applied to the first electrode 20.

As the radio frequency power is applied to the first electrode 20, glow discharge is generated between the first and second electrodes 20 and 30, so that electrons generated due to the glow discharge obtain sufficient energy and collide with the gases $SiH_4$ and $H_2$, causing generation of various ions and radicals of the gases $SiH_4$ and $H_2$. The ions and radicals are attached to the substrate 100 loaded on the second electrode 30. Particularly, the radicals of $SiH_3$ attached to the surface of the substrate 100 grow into the amorphous silicon layer through surface reaction.

Properties of the amorphous silicon layer formed through the above process may vary depending on the temperature of the chamber 10, the plasma radio frequency power, pressure of the chamber 10, a distance between the first and second electrodes 20 and 30, or a composition ratio of the gases.

The amorphous silicon formed through the above process has coordination number, bond angle, and bond length similar to those of crystalline silicon in a small range. However, the amorphous silicon has irregularity in a large range, because the amorphous silicon includes hydrogen. Generally, the amorphous silicon has many dangling bonds and a localized state. In order to remove the dangling bonds and the localized state, the hydrogen is included in the amorphous silicon.

Figure 2A:
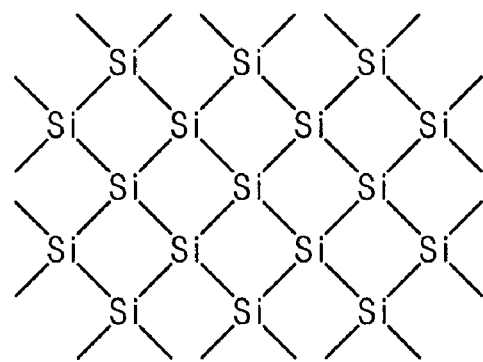
FIGS. 2A and 2B are schematic views illustrating atom arrangements of crystalline silicon and amorphous silicon containing hydrogen according to an embodiment.
Figure 2B:
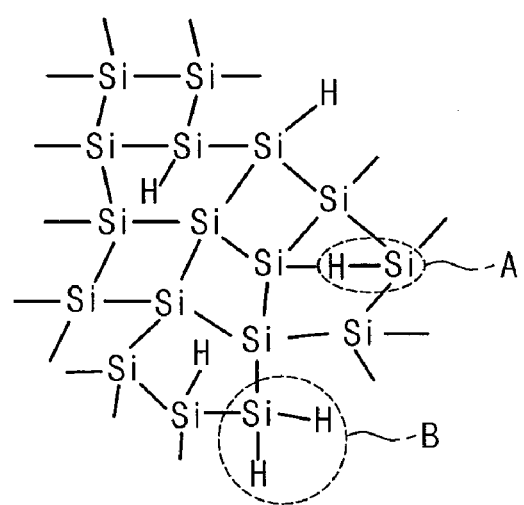

FIGS. 2A and 2B are schematic views illustrating atom arrangements of the crystalline silicon and the amorphous silicon including hydrogen.

As illustrated in FIGS. 2A and 2B, the crystalline silicon represents regular atom arrangement and the amorphous silicon has a random bonding structure. Since each atom in silicon has four valence electrons, each atom may be bonded to four silicon atoms. However, in the amorphous silicon including the hydrogen, a part of four bonding positions is replaced with the hydrogen, so that the hydrogen is bonded to a silicon atom. Thus, some silicon atoms may be bonded to four silicon atoms, and other silicon atoms may be bonded to three silicon atoms and one hydrogen atom, or two silicon atoms and two hydrogen atoms. In one or more embodiments of the present invention, in order to classify the silicon bonding according to the number of hydrogen atoms, Si—H bonding (marked by A in FIG. 2B) refers to the bonding structure having three silicon atoms and one hydrogen, and Si—$H_2$ bonding (marked by B in FIG. 2B) refers to the bonding structure having two silicon atoms and two hydrogen atoms.

However, in the amorphous silicon including the hydrogen, weak bonding may be broken due to light irradiation for a prolonged period of time, injection of carriers, strong accumulation in a conductive channel of a hydrogenated amorphous silicon thin film transistor, or doping, so that a defect may occur. This is because the hydrogen has a small size, one valence electron, and can easily move as compared with the silicon atom having four valence electrons while being relatively heavier than the hydrogen. Thus, if the number of the Si—$H_2$ bonds is relatively greater than the number of the Si—H bonds in the normal amorphous silicon, a defect increases, so that a defect rate of a thin film transistor formed using the amorphous silicon layer may be increased. In this regard, as would be understood by one skilled in the art, the amorphous silicon layer is formed so that the ratio of the Si—$H_2$ bonding to the Si—H bonding is reduced, particularly, the number of the Si—H bonds is at least 16 times as many as the number of the Si—$H_2$ bonds. In a normal amorphous silicon thin film fabricated through a CVD process, the number of the Si—H bonds is about 20 times as many as the number of the Si—$H_2$ bonds.

However, according to an embodiment of the present invention, the amorphous silicon layer having superior device properties can be provided while maintaining the number of Si—$H_2$ bonds in a range of at least a quarter of the number of the Si—H bonds under predetermined process conditions. In other words, the number of the Si—H bonds is as many as the number of Si—$H_2$ bonds by four times or less.

Further, according to an exemplary embodiment of the present invention, the amorphous silicon layer is formed when the chamber 10 has the temperature in a range of about 100° C. to about 180° C.

Hereinafter, the process conditions according to embodiments of the present invention will be described in further detail. According to an embodiment of the present invention, the amorphous silicon layer is formed under predetermined process conditions, a thin film transistor is formed by using the amorphous silicon layer as a semiconductor layer, and properties of thin film transistor are inspected.

Example 1

Pressure of Chamber

According to an embodiment, the amorphous silicon layer is formed while changing the pressure in the chamber 10 when the percentage of $SiH_4$ to $H_2$, which are supplied to the chamber 10 of the CVD equipment, have a value of about 3% by volume, a distance between the first and second electrodes 20 and 30 is about 2.0 cm, and radio frequency power applied to the first electrode 20 is about 150 W.

Figure 3:
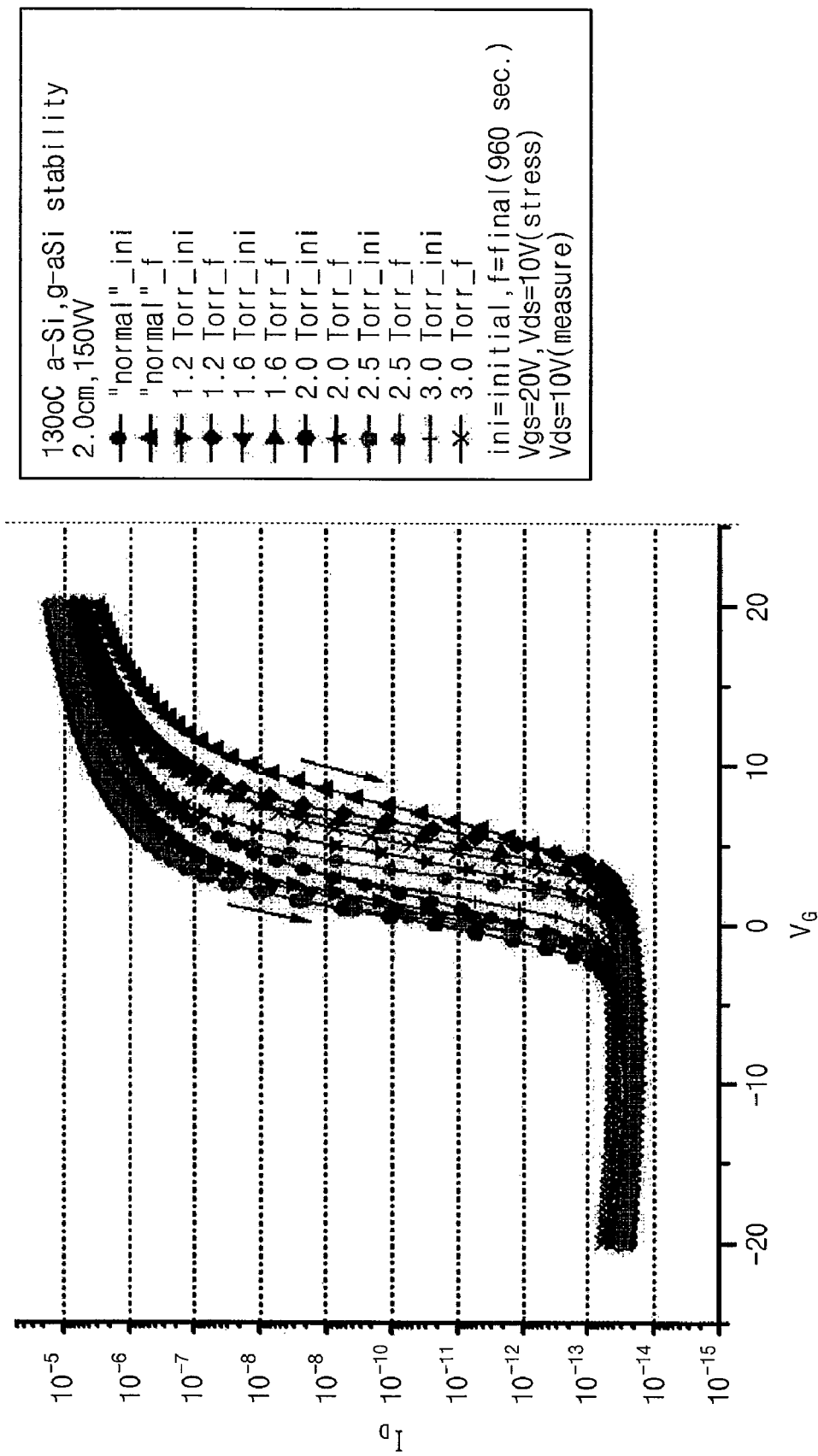
FIG. 3 is a V-I graph of a thin film transistor according to change in pressure of a chamber according to an embodiment.

FIG. 3 is a V-I graph illustrating the thin film transistor according to change in the pressure of the chamber. FIG. 3 shows the amount of current on a drain electrode as a function of voltage applied to a gate electrode of the thin film transistor. In FIG. 3, a solid line marked by 'normal' represents that the amorphous silicon layer is formed using a conventional CVD method. According to the CVD method, gas phase material is reacted on a substrate at the high temperature to generate a solid phase on the substrate. At this time, the distance between the first and second electrodes 20 and 30 is about 1.3 cm, the radio frequency power applied to the first electrode 20 is about 200 W, and the pressure in the chamber 10 is about 1.5 Torr.

As illustrated in FIG. 3, when the pressure of the chamber 10 is changed from about 1.2 Torr to about 3.5 Torr, $V_{th}$ shift values are less than those of the related art. Particularly, the $V_{th}$ shift values are small at the pressure of about 1.6 Torr or more.

Further, as the pressure is increased until the pressure reaches about 2.5 Torr, $V_{th}$ shift degree is reduced. However, if the pressure reached about 3.0 Torr, the $V_{th}$ shift degree is increased. This is because clusters of silicon are damaged due to excessive energy of particles accelerated by plasma if the pressure of the chamber 10 is relatively low as compared with the power, and the number of the Si—$H_2$ bonds is increased in the clusters of silicon due to insufficient dissociation of $SiH_4$ if the pressure of the chamber 10 is too high.

Example 2

Distance Between First and Second Electrodes

According to an exemplary embodiment, the amorphous silicon layer is formed while changing the distance between the first and second electrodes 20 and 30 and the thin film transistor is formed using the amorphous silicon layer as a semiconductor layer when the percentage of $SiH_4$ to $H_2$, which are supplied to the chamber 10 of the CVD equipment, has a value of about 3% by volume, the pressure in the chamber 10 is about 2.5 Torr, and the radio frequency power is about 150 W.

Figure 4:
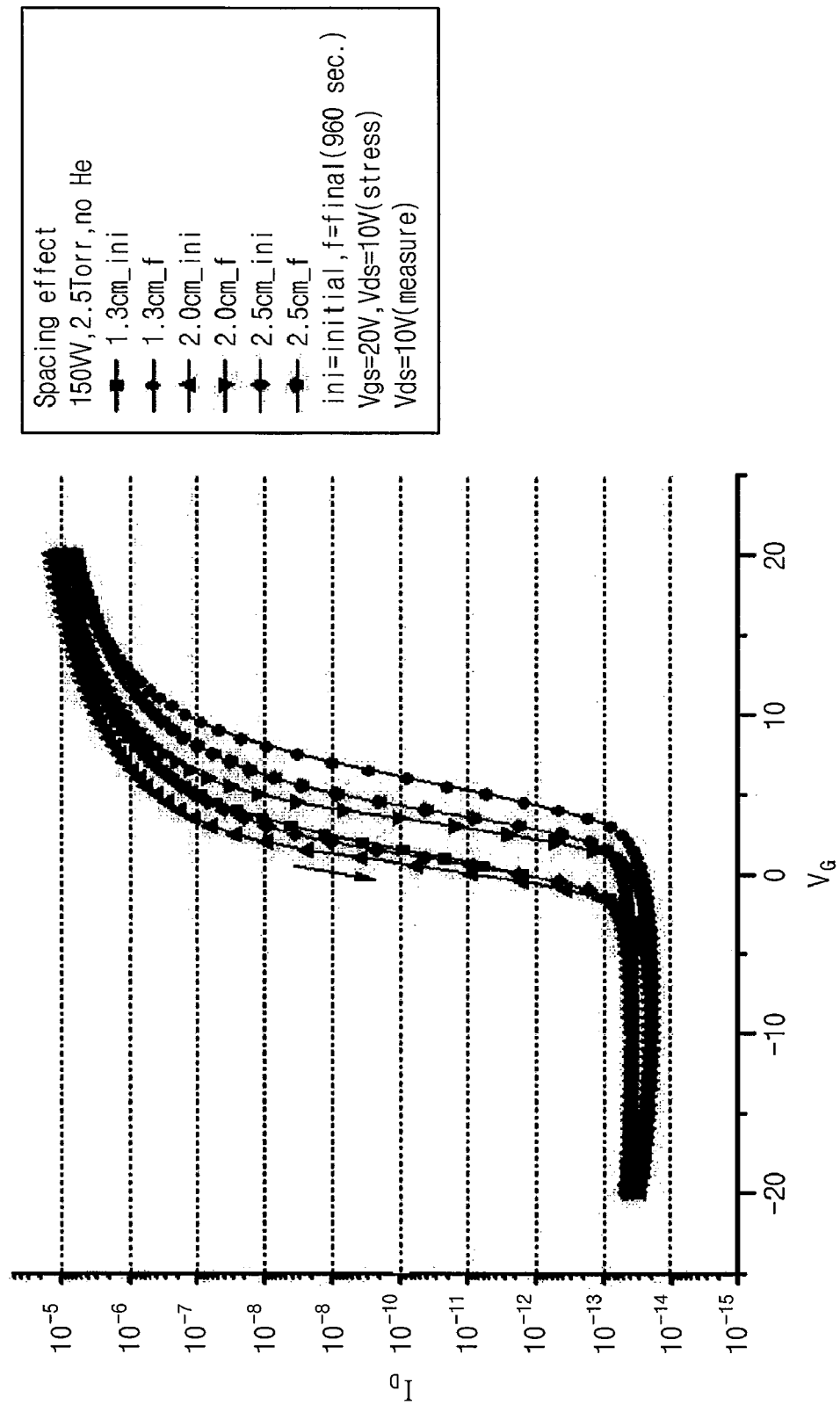
FIG. 4 is a V-I graph of a thin film transistor according to change in a distance between first and second electrodes according to an embodiment.

FIG. 4 is a V-I graph illustrating the thin film transistor.

As illustrated in FIG. 4, the distance between the first and second electrodes 20 and 30 is greater than about 1.0 cm and less than about 3.0 cm according to the present embodiment. The shift of the $V_{th}$ does not significantly occur. However, the smallest $V_{th}$ shift degree occurs when the distance between the first and second electrodes 20 and 30 is about 2.0 cm.

Example 3

Deposition Rate (Å/s) with Respect to Radio Frequency Power and Chamber Pressure According to an exemplary embodiment, the amorphous silicon layer is formed while changing the radio frequency power and the pressure of the chamber 10 when the percentage of $SiH_4$ to $H_2$, which are supplied to the chamber 10 of the CVD equipment, has a value of about 3% by volume, and the distance between the first and second electrodes 20 and 30 is about 2.0 cm.

Figure 5:
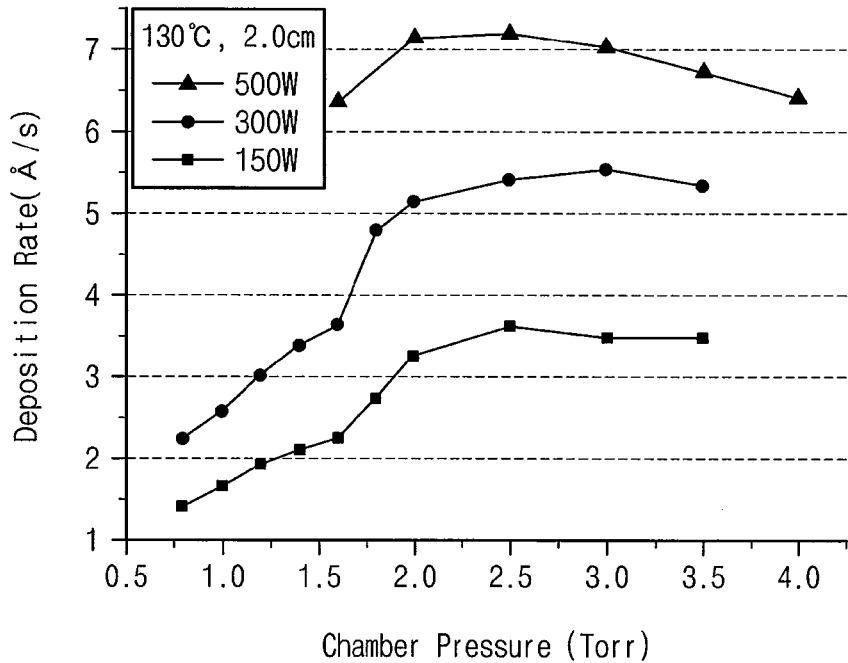
FIG. 5 is a graph illustrating a deposition rate as a function of pressure of a chamber and radio frequency power according to an embodiment.

Table 1 below shows the deposition rate (Å/s) with respect to the pressure of the chamber and the radio frequency power, and FIG. 5 is a graph illustrating resultant values of Table 1.

TABLE 1

| Chamber pressure | 150 W | 300 W | 500 W |
| --- | --- | --- | --- |
| 1.6 Torr | 2.25 | 3.65 | 6.37 |
| 2.0 Torr | 3.25 | 5.13 | 7.15 |
| 2.5 Torr | 3.62 | 5.40 | 7.19 |
| 3.0 Torr | 3.48 | 5.53 | 7.04 |
| 3.5 Torr | 3.48 | 5.34 | 6.73 |
| 4.0 Torr | — | — | 6.41 |

As shown in Table 1, the deposition rate is increased as the radio frequency power is increased from 150 W to 300 W and 500 W. This is because radicals of reaction gas is increased due to the increased radio frequency power and thus deposition is easily performed. When the radio frequency power is about 150 W and the pressure of the chamber 10 is about 3.62 Torr, the deposition rate is 3.62 Å/s. Further, the highest deposition rate is 7.19 Å/s when the radio frequency power is about 500 W and the pressure in the chamber 10 is about 2.5 Torr. This value is similar to a deposition rate of aluminum at the temperature of about 220° C. and corresponds to a very high deposition rate.

Example 4

Properties of Thin Film Transistor According to Radio Frequency Power and Chamber Pressure According to an embodiment, a state is utilized in which fabricating the thin film transistor includes the use of the amorphous silicon layer as the semiconductor layer according to example 3 discussed herein, wherein the $V_{th}$ shift degree and an on current value are measured after $V_g$ of 20V, $V_{ds}$ of 10V and DC bias stress of 60° C. are applied to the thin film transistor for one hour.

Figure 6:
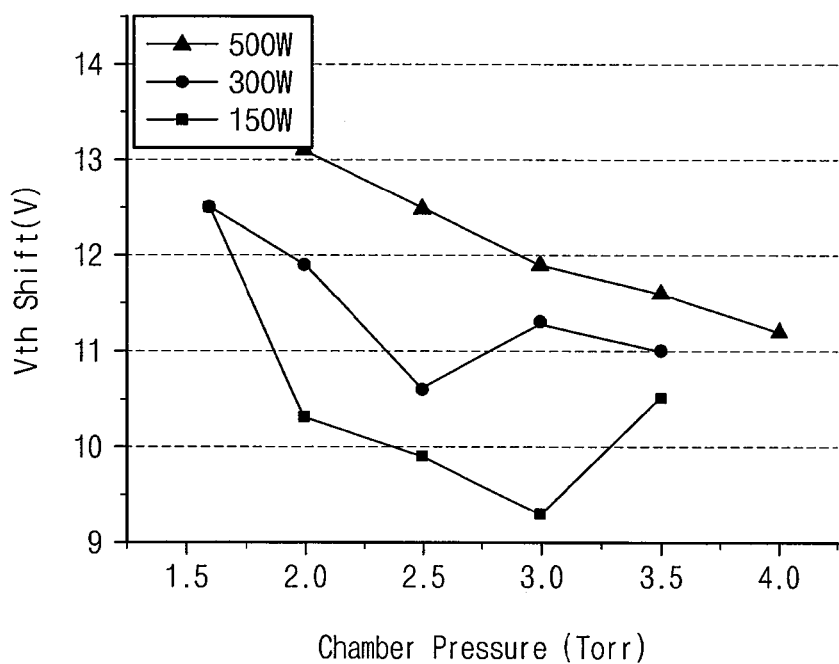
FIG. 6 is a graph illustrating $V_{th}$ shift degree of a thin film transistor as a function of pressure of a chamber as radio frequency power is changed according to an embodiment.

Table 2 below shows the $V_{th}$ shift value with respect to the pressure in the chamber and the radio frequency power, and FIG. 6 is a graph illustrating the $V_{th}$ shift degree of the thin film transistor as a function of the pressure in the chamber when the radio frequency power is changed to 150 W, 300 W, and 500 W.

TABLE 2

| Chamber pressure | 150 W | 300 W | 500 W |
|---|---|---|---|
| 1.6 Torr | 12.5 | 12.5 | 13.8 |
| 2.0 Torr | 10.3 | 11.9 | 13.1 |
| 2.5 Torr | 9.9 | 10.6 | 12.5 |
| 3.0 Torr | 9.3 | 11.3 | 11.9 |
| 3.5 Torr | 10.5 | 11.0 | 11.6 |
| 4.0 Torr | — | — | 11.2 |

Table 3 below shows an $I_{on}$ value (μA) with respect to the pressure in the chamber and the radio frequency power, and Table 4 below shows a reduction value (multiple value) of the $I_{on}$ with respect to the pressure of the chamber and the radio frequency power.

Figure 7:
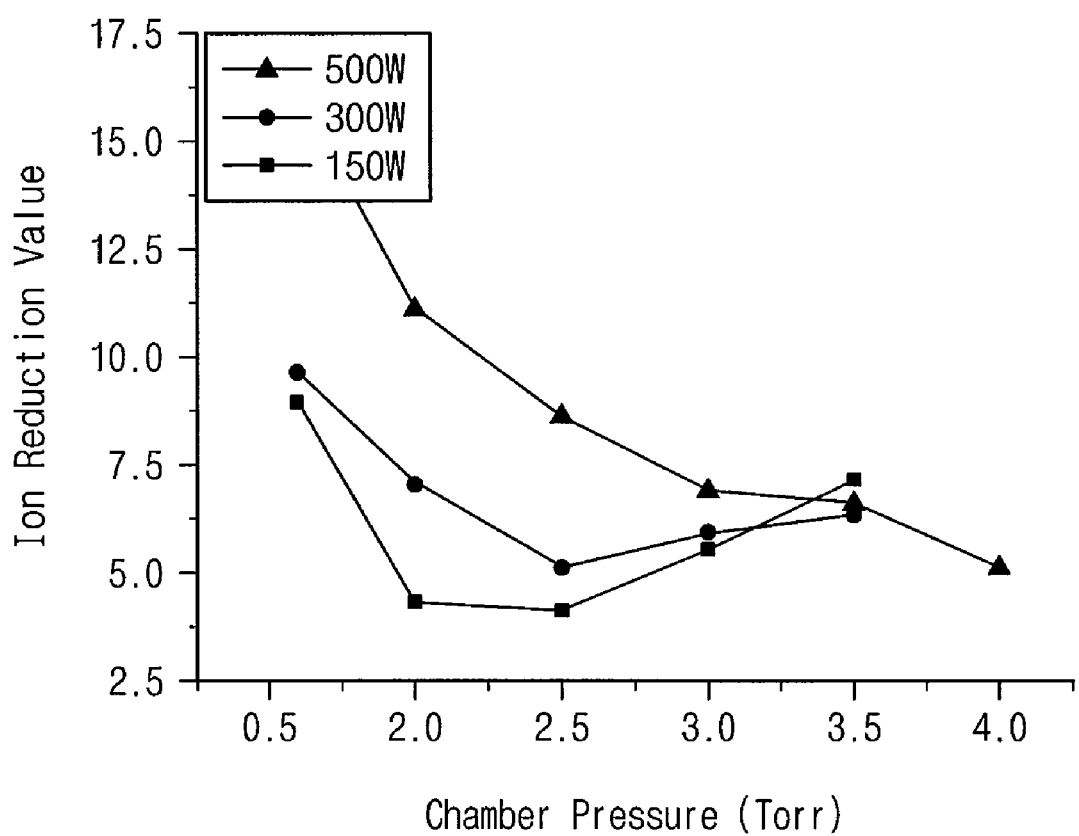
FIG. 7 is a graph illustrating a reduction value of on current $I_{on}$ of a thin film transistor as a function of pressure in a chamber as radio frequency power is changed according to an embodiment.

FIG. 7 is a graph illustrating resultant values of Table 4 and shows the reduction value (multiple value) of $I_{on}$ of the thin film transistor as a function of the pressure in the chamber when the radio frequency power is changed to 150 W, 300 W, and 500 W.

TABLE 3

| Chamber pressure | 150 W | 300 W | 500 W |
|---|---|---|---|
| 1.6 Torr | 10.4 | 8.3 | 5.8 |
| 2.0 Torr | 16.1 | 12.1 | 8.7 |
| 2.5 Torr | 13.1 | 12.7 | 11.1 |
| 3.0 Torr | 10.3 | 11.5 | 12.6 |
| 3.5 Torr | 7.0 | 10.0 | 12.4 |
| 4.0 Torr | — | — | 14.9 |

TABLE 4

| Chamber pressure | 150 W | 300 W | 500 W |
|---|---|---|---|
| 1.6 Torr | 8.9 | 9.6 | 16.0 |
| 2.0 Torr | 4.3 | 7.0 | 11.1 |
| 2.5 Torr | 4.1 | 5.1 | 8.6 |
| 3.0 Torr | 5.5 | 5.9 | 6.9 |
| 3.5 Torr | 7.1 | 6.3 | 6.6 |
| 4.0 Torr | — | — | 5.1 |

Referring to Table 3, when the radio frequency power is about 150 W and the pressure of the chamber 10 is about 2.0 Torr, $I_{on}$ has the highest value of 16.1 μA. Further, when the radio frequency power is about 500 W and the pressure of the chamber 10 is about 4.0 Torr, $I_{on}$ has a value of 14.9 μA.

Referring to Table 4, when the radio frequency power is about 150 W and the pressure of the chamber 10 is about 2.5 Torr, the reduction value of $I_{on}$ is 4.1 times as low as the initial value and represented the smallest value. Further, when the radio frequency power is about 300 W and the pressure in the chamber 10 is about 2.5 Torr and the radio frequency power is about 500 W and the pressure of the chamber 10 is about 4.0 Torr, the reduction value of $I_{on}$ is 5.1 times as low as the initial value, and is greater than that when the radio frequency power is about 150 W.

As illustrated in FIGS. 6 and 7, the $V_{th}$ shift value and the reduction value of $I_{on}$ are reduced as the pressure is increased and then increased at predetermined pressure (about 2.5 Torr) or more. At this time, when the radio frequency power is increased, the $V_{th}$ shift degree or the reduction degree of $I_{on}$ is significantly increased, so that the reliability of the thin film transistor is degraded. The $V_{th}$ shift value is small when the radio frequency power is about 150 W and the pressure of the chamber 10 is about 3.0 Torr, however, this phenomenon is generated because the initial $V_{th}$ value is large different from that of the previous case.

As illustrated in FIGS. 6 and 7, the $V_{th}$ shift value and the reduction value of $I_{on}$ represented the smallest values when the radio frequency power is about 150 W. In detail, when the pressure of the chamber 10 is about 2.5 Torr, the $V_{th}$ shift value is about 9.9V and the reduction value of $I_{on}$ is only 4.1 times.

As it can be seen from FIGS. 5 to 7, since the $V_{th}$ shift value and the reduction value of $I_{on}$ are reduced inverse-proportionally to the radio frequency power, the reliability of the thin film transistor is increased but the deposition rate is reduced, which represents a trade-off. Thus, process conditions capable of ensuring the maximum deposition rate in the range in which the reliability of the thin film transistor is improved must be provided as follows.

Referring to Tables 1 to 4, the superior properties of the thin film transistor can be obtained when the pressure in the chamber 10 is about 1.6 Torr to about 3.5 Torr, for example, about 2.0 Torr to about 3.0 Torr, as a further example, about 2.5 Torr. If the pressure is lower or higher than a predetermined value, the $V_{th}$ value is excessively increased and the deposition rate is reduced.

Since the $V_{th}$ shift value is increased when the distance between the two electrodes is less than about 1.0 cm, the properties of the thin film transistor are degraded. Further, when the distance between the two electrodes is greater than about 3.0 cm, the uniformity of the amorphous silicon layer to be formed is degraded. The distance between the two electrodes may be greater than about 1.3 cm and less than about 2.5 cm. For example, the distance between the two electrodes is about 2.0 cm.

Further, the superior properties of the thin film transistor are obtained when the radio frequency power is about 150 W to about 500 W, for example, about 150 W to about 200 W, as a further example, about 150 W. If the radio frequency power is higher than a predetermined value, the $V_{th}$ value is increased and the reduction value of $I_{on}$ is increased. However, if the radio frequency power is lower than the predetermined value, the deposition rate is excessively reduced.

Under the above process conditions, the amorphous silicon layer can be formed using the CVD method at the low temperature of about 100° C. to about 180° C., and the superior properties of the thin film transistor including the $V_{th}$ value can be obtained.

Figure 8:
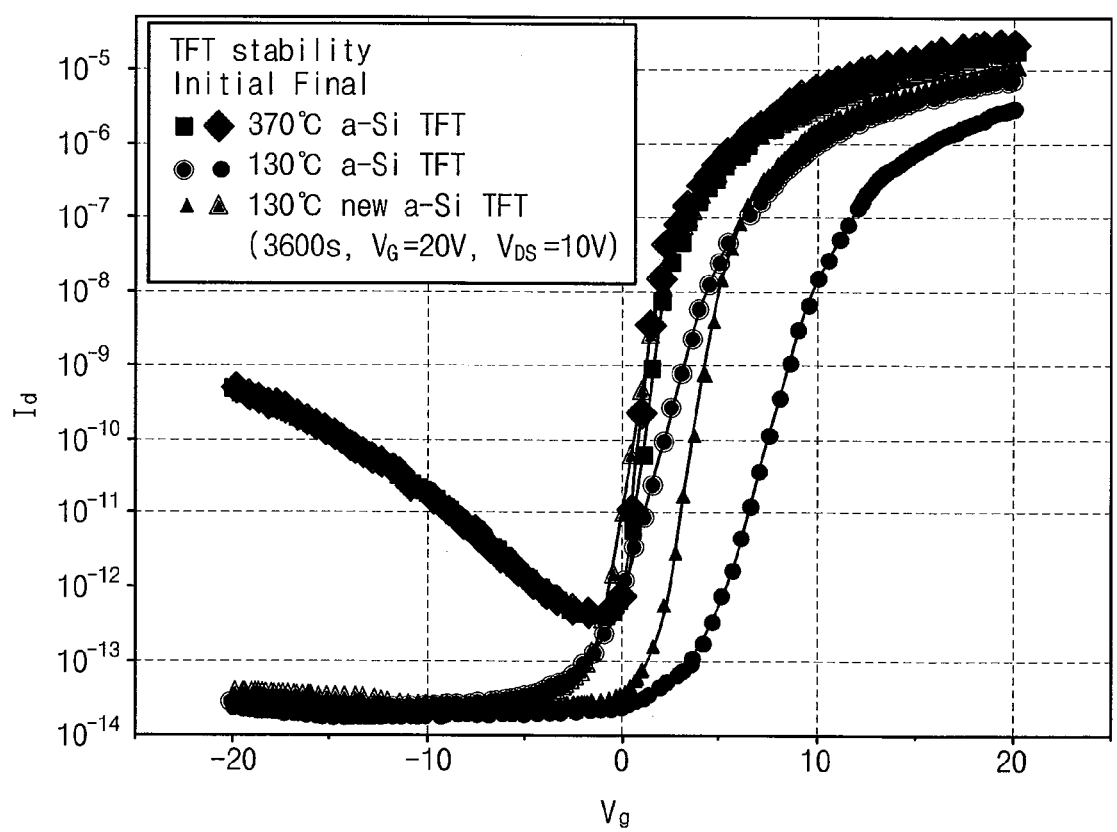
FIG. 8 is a V-I graph of a thin film transistor using an amorphous silicon layer formed by changing temperature according to a conventional CVD method and that of a thin film transistor using an amorphous silicon layer formed according to an embodiment of the present invention.

FIG. 8 is a graph illustrating the properties (marked by 370° C. a-Si TFT) of a thin film transistor using an amorphous silicon layer formed using the CVD method at the high temperature of about 370° C., the properties (marked by 130° C. a-Si TFT) of a thin film transistor using an amorphous silicon layer formed using the CVD method, and the properties (marked by 130° C. new a-Si TFT) of the thin film transistor using the amorphous silicon layer according to an embodiment of the present invention. The properties of the thin film transistor is measured after $V_g$ of 20V, $V_{ds}$ of 10V and DC bias stress of 60° C. are applied to the thin film transistor for about one hour.

As illustrated in FIG. 8, in the case of the amorphous silicon layer formed at the low temperature of about 130° C. according to the conventional method, the $V_{th}$ shift is high. However, in the case of the amorphous silicon layer formed according to an embodiment of the present invention, the $V_{th}$ shift is similar to that of the amorphous silicon layer formed at the high temperature of about 370° C., and the properties of the thin film transistor are improved.

Although the amorphous silicon layer formed according to an embodiment of the present invention are formed at the low temperature, the similar properties to that of the thin film transistor can be obtained and the ratio of Si—H bonding to Si—$H_2$ bonding is very different from that of the related art.

Table 5 below shows the ratio of Si—H bonding to Si—$H_2$ bonding. The amorphous silicon shown in Table 5 is formed with a thickness of about 1500 Å when the process temperature is about 130° C., the volume ratio of $H_2$ to $SiH_4$ has a value of about 3%, the distance between the two electrodes is about 2 cm, and the temperature of the chamber is about 130° C., except for the normal amorphous silicon formed using the conventional CVD method.

The Si—H bonding and the Si—$H_2$ bonding can be checked using fourier transform infrared spectroscopy (FT-IR), and stretching of the Si—H is shown at about 1850 cm$^{-1}$ and about 2200 cm$^{-1}$ and the peak value thereof is shown at about 20000 cm$^{-1}$. The Si—$H_2$ has a peak value at about 2100 cm$^{-1}$.

TABLE 5

| Number | Radio frequency power | Chamber pressure | Si—H/Si—$H_2$ |
|---|---|---|---|
| 1 | Normal amorphous silicon | 1.6 Torr | 19.1 |
| 2 | 150 W | 2.0 Torr | 3.6 |
| 3 | 150 W | 2.5 Torr | 2.3 |
| 4 | 150 W | 3.0 Torr | 1.8 |
| 5 | 150 W | 3.5 Torr | 1.5 |
| 6 | 150 W | 2.5 Torr | 1.2 |
| 7 | 300 W | 2.5 Torr | 3.0 |
| 8 | 500 W | 2.5 Torr | 2.9 |

Table 5 represents that the amorphous silicon layer formed in the process conditions according to an embodiment of the present invention has the ratio of Si—H bonding to Si—$H_2$ bonding, which is very different from that of the conventional amorphous silicon layer.

In the normal amorphous silicon, since a defect is increased proportionally to the number of Si—$H_2$ bonds and thus the properties of the thin film transistor are degraded, the ratio of Si—H bonding to Si—$H_2$ bonding has a value equal to or greater than 16. As it can be seen from Table 5, the ratio of Si—H bonding to Si—$H_2$ bonding has a value of about 20.

However, in the case of the amorphous silicon layer formed at the low temperature of 130° C. according to an embodiment of the present invention, the ratio of Si—H bonding to Si—$H_2$ bonding is equal to or less than 4 while obtaining the similar properties of the thin film transistor to that of the conventional. For example, in the amorphous silicon layer formed when the radio frequency power is about 150 W and the pressure in the chamber is about 3.5 Torr, the ratio of Si—H bonding to Si—$H_2$ bonding has a value of only 1.2, that is, the number of Si—$H_2$ bonds is very high. Particularly, as it can be seen from Table 5, the ratios of Si—H bonding to Si—$H_2$ bonding according to each embodiment have values of about 1.2, about 1.5, about 1.8, about 2.3, about 2.9, about 3.0, and about 3.6, respectively.

Method of Fabricating an LCD Using Amorphous Silicon

A thin film transistor substrate can be formed using the amorphous silicon layer formed according to an embodiment of the present invention as a semiconductor layer, and the LCD can be fabricated using the substrate. Hereinafter, the method of fabricating the LCD according to an embodiment of the present invention will be described.

Figure 9:
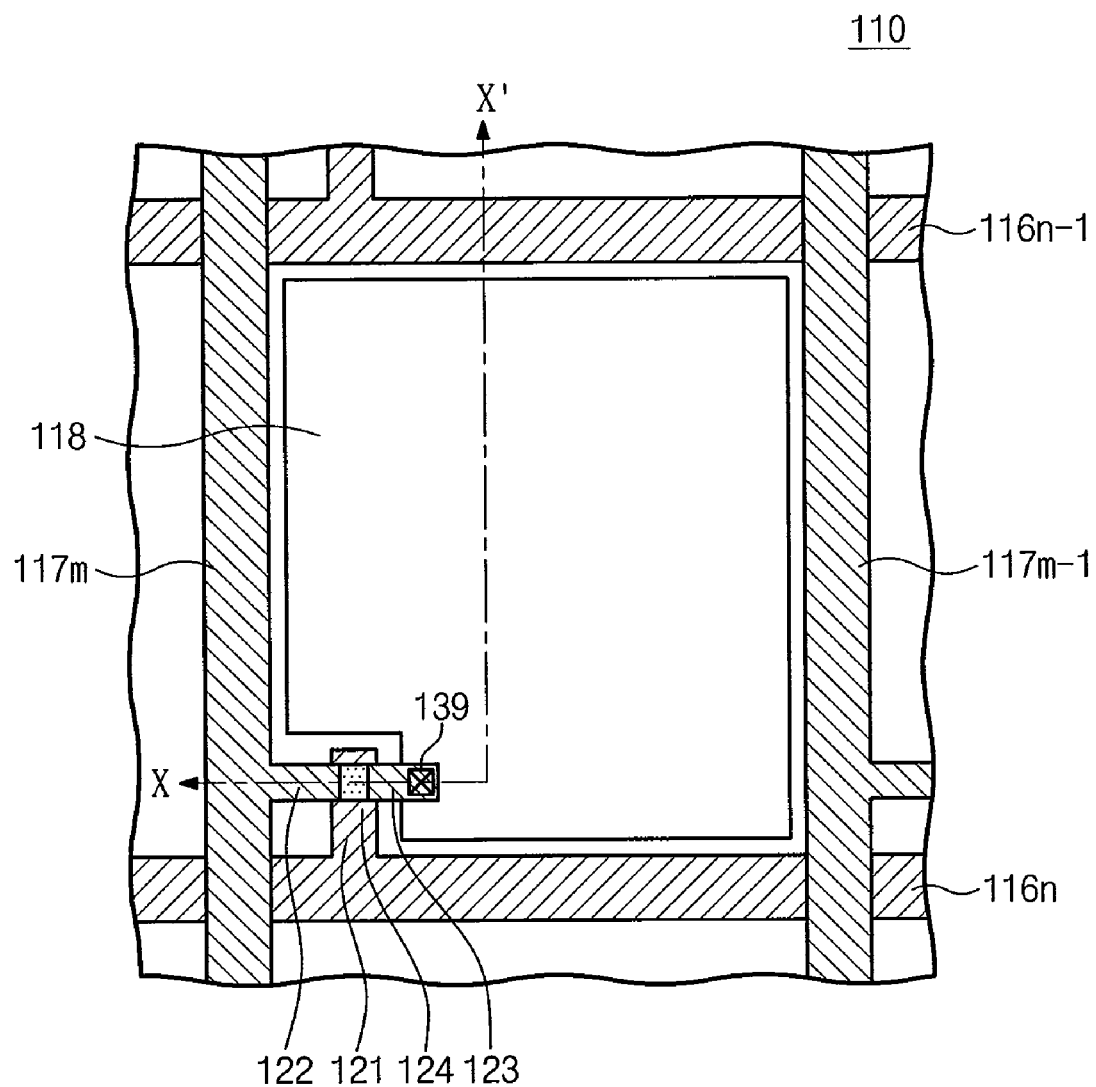
FIG. 9 is a plan view illustrating a part of a thin film transistor substrate of an LCD according to an embodiment of the present invention.

FIG. 9 is a plan view illustrating a part of the thin film transistor substrate of the LCD according to an embodiment of the present invention. The thin film transistor substrate includes (m×n) pixels defined by N gate lines and M data lines crossing the N gate lines. However, for the convenience of explanation, FIG. 9 shows an (m×n)$^{th}$ pixel.

As illustrated in FIG. 9, the thin film transistor substrate 110 includes an n$^{th}$ gate line 116n and an m$^{th}$ data line 117m, which define an (m×n)$^{th}$ pixel area while being arranged in longitudinal and transverse directions on the thin film transistor substrate 110. A thin film transistor is formed in the pixel area defined by the n$^{th}$ gate line 116n and the m$^{th}$ data line 117m to serve as a switching device. A pixel electrode 118 is connected with the thin film transistor in the pixel area to drive liquid crystal (not shown) together with a common electrode of an opposite substrate (not shown).

The thin film transistor includes a gate electrode 121 that is a part of the n$^{th}$ gate line 116n, a source electrode 122 connected with the m$^{th}$ data line 117m, and a drain electrode 123 connected with the pixel electrode 118. Further, the thin film transistor includes a first insulating layer (not shown) that insulates the gate electrode 121 from the source and drain electrodes 122 and 123, and an active pattern (not shown) that forms a conductive channel between the source and drain electrodes 122 and 123 when gate voltage applied to the gate electrode 121.

A part of the source electrode 122 is connected with the m$^{th}$ data line 117m to serve as a part of the m$^{th}$ data line 117m, and a part of the drain electrode 123 extends toward the pixel area to be electrically connected with the pixel electrode 118 through a contact hole 139 formed in a second insulating layer (not shown).

FIGS. 10A to 10E are sectional views taken along line X-X' of the thin film transistor substrate shown in FIG. 9, which sequentially illustrate the fabricating process of the thin film transistor substrate.

Figure 10A:
FIGS. 10A to 10F are sectional views taken along line X-X' of a thin film transistor substrate shown in FIG. 9, which sequentially illustrate a fabricating process of a thin film transistor substrate according to an embodiment of the present invention.

As illustrated in FIG. 10A, the gate electrode 121 and an (n−1)$^{th}$ gate line 116n−1 are formed on the substrate 110 including transparent insulating material such as glass or plastic. The gate electrode 121 and the (n−1)$^{th}$ gate line 116n−1 are formed by depositing a first conductive layer on the entire surface of the substrate 110 and then patterning the first conductive layer using a photolithography process.

Figure 10B:
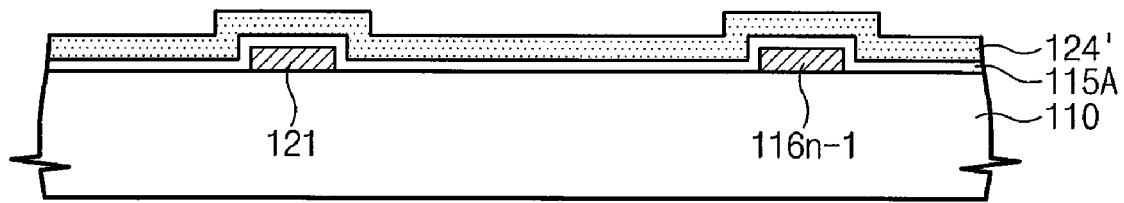

Next, as illustrated in FIG. 10B, a gate insulating layer 115A is formed on the entire surface of the substrate 110 including the gate electrode 121 and the (n−1)$^{th}$ gate line 116n−1, and an amorphous silicon layer 124' is deposited on the gate insulating layer 115A using the amorphous silicon layer forming method according to the process conditions of an embodiment as described above.

Figure 10C:
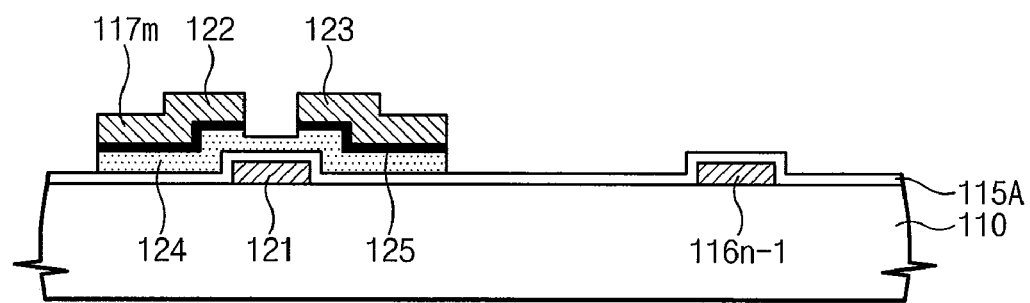

Then, as illustrated in FIG. 10C, impurities ions are implanted onto the amorphous silicon layer 124', a second conductive layer is deposited on the amorphous silicon layer 124', and the amorphous silicon layer 124' and the second conductive layer are selectively patterned to form an active pattern 124 including the amorphous silicon above the gate electrode 121 and simultaneously form the source and drain electrodes 122 and 123 which include the second conductive layer.

Thereafter, an ohmic contact layer 125 including the n+ amorphous silicon layer is formed on the active pattern 124. In detail, the ohmic contact layer 125 is patterned to have the same shape as that of the source and drain electrodes 122 and 123 and forms ohmic contact between a predetermined area of the active pattern 124 below the ohmic contact layer 125 and the source and drain electrodes 122 and 123. The source electrode 122 serves as a part of an $m^{th}$ data line 117$m$ that defines the corresponding pixel area while crossing the $(n-1)^{th}$ gate line 116$n$-1.

A process of forming the active pattern 124, the ohmic contact layer 125, and the source and drain electrodes 122 and 123 can be simultaneously formed using a diffraction mask or a halftone mask through a one-time photolithography process. However, the scope of the present invention is not limited thereto. For example, according to another embodiment, impurities ions are implanted onto the amorphous silicon layer 124' and the amorphous silicon layer 124' is selectively patterned using a photolithography process to form the active pattern 124 and the ohmic contact layer 125. Then, the second conductive layer is deposited on the entire surface of the substrate and the source and drain electrodes 122 and 123 are formed using the photolithography process.

Figure 10D:
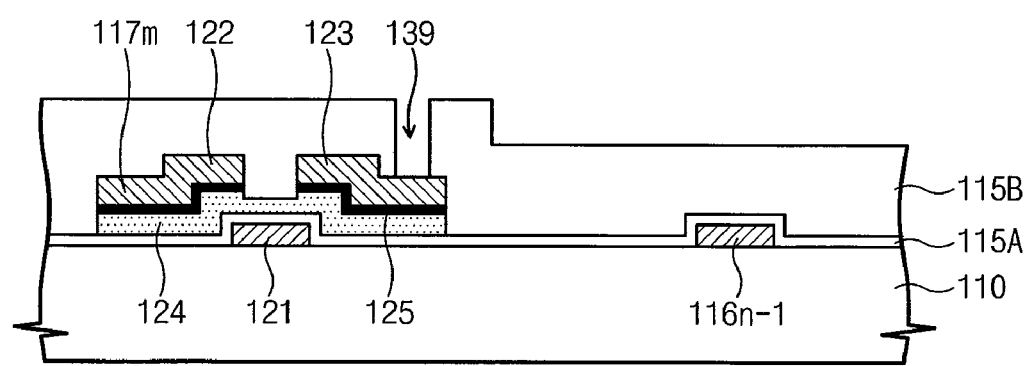

Next, as illustrated in FIG. 10D, a protective layer 115B is deposited on the entire surface of the substrate 110 including the source and drain electrodes 122 and 123, and a part of the protective layer 115B is removed using the photolithography process to form a contact hole 139 that exposes a part of the drain electrode 123.

Figure 10E:
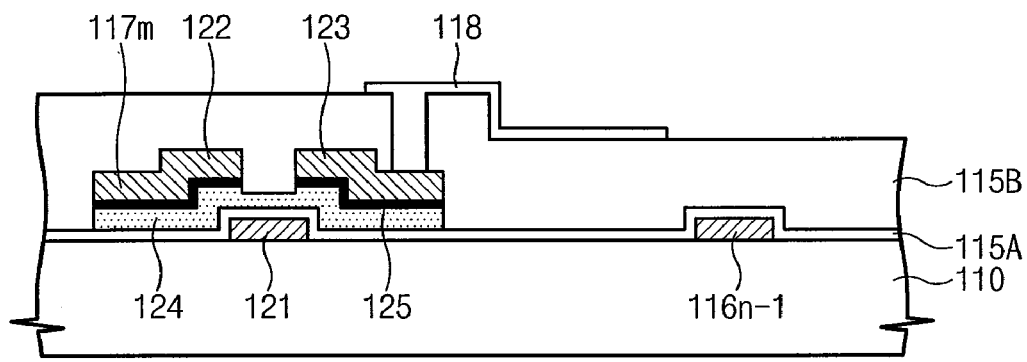

Then, as illustrated in FIG. 10E, transparent conductive material is deposited on the entire surface of the substrate 110 and is selectively patterned using the photolithography process to form the pixel electrode 118 electrically connected with the drain electrode 123 through the contact hole 139.

The transparent conductive material includes conductive material having high transmittance such as indium tin oxide (ITO) or indium zinc oxide (IZO).

Figure 10F:
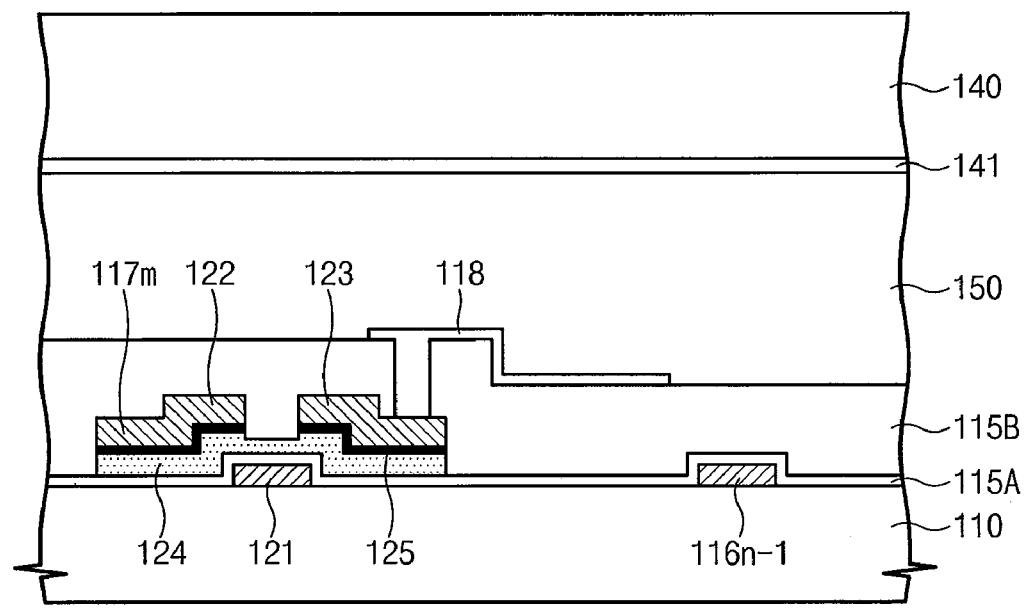

Thereafter, as illustrated in FIG. 10F, an opposite substrate 140 having a common electrode 141 on the entire surface thereof is aligned to face the thin film transistor substrate 110, and a liquid crystal layer is formed between the substrates 110 and 140, thereby completing fabrication of a liquid crystal panel.

One or more embodiments describes the thin film transistor substrate in the LCD as an example. However, the scope of the present invention is not limited thereto. In detail, one or more embodiments of the present invention can be applied to another apparatus capable of using an amorphous silicon layer transistor employing an amorphous silicon layer as a channel layer. For example, one or more embodiments of the present invention can be applied to another display apparatus fabricated using a thin film transistor as well as the LCD, e.g. an organic light emitting display apparatus including an organic light emitting device connected with a driving transistor, or a plasma display panel.

Although the various embodiments of the present invention have been described, it is understood that the present invention should not be limited to these exemplary embodiments but various changes and modifications can be made by one ordinary skilled in the art within the spirit and scope of the present invention as hereinafter claimed. For example, an embodiment of the present invention describes a twisted nematic LCD. However, one or more the present invention can be applied, for example, to a lateral electric field LCD or a vertical alignment LCD through various modifications thereof.

What is claimed is:

1. A method of forming an amorphous silicon layer, the method comprising:
preparing a substrate; and
forming an amorphous silicon layer in which a ratio of Si—H bonding to Si—H$_2$ bonding has a value equal to or less than 4 to 1, the amorphous silicon layer being formed on the substrate using chemical vapor deposition equipment,
wherein the chemical vapor deposition equipment comprises:
a chamber;
first and second electrodes in the chamber, the first and second electrodes facing each other;
a gas supply to supply SiH$_4$ and H$_2$ to the chamber; and
a power supply to apply power to the first and second electrodes, and
wherein a pressure of the chamber is about 1.6 Torr to about 3.5 Torr, a percentage of SiH$_4$ to H$_2$ to be supplied to the gas supply unit is about 1% by volume to about 4% by volume, the power is about 150 W to about 500 W, a distance between the first and second electrodes is about 1.3 cm to about 2.5 cm, and a temperature of the chamber is about 100° C. to about 180° C.

2. The method of claim 1, wherein the ratio of Si—H bonding to Si—H$_2$ bonding has a value equal to or greater than 1.2 to 1 and equal to or less than 3.6 to 1.

3. The method of claim 1, wherein the pressure of the chamber is about 2.5 Torr.

4. The method of claim 1, wherein the percentage of SiH$_4$ to H$_2$ to be supplied to the gas supply unit has a value of about 3% by volume.

5. The method of claim 1, wherein the power is about 150 W.

6. The method of claim 1, wherein the distance between the first and second electrodes is about 2.0 cm.

7. The method of claim 3-1, wherein the temperature of the chamber is about 130° C.

8. The method of claim 1, wherein the substrate comprises a flexible substrate.

9. A method of forming an amorphous silicon layer, the method comprising:
preparing a substrate; and
forming an amorphous silicon layer on the substrate using chemical vapor deposition equipment,
wherein the chemical vapor deposition equipment comprises:
a chamber;
first and second electrodes positioned in the chamber, the first and second electrodes facing each other;
a gas supply unit to supply SiH$_4$ and H$_2$ to the chamber; and
a power supply to apply power to the first and second electrodes,
wherein a pressure of the chamber is about 1.6 Torr to about 3.5 Torr, a percentage of SiH$_4$ to H$_2$ to supply to the gas supply unit has a value of about 1% by volume to about 4% by volume, a power is about 150 W to about 500 W, a distance between the first and second electrodes is about 1.3 cm to about 2.5 cm, and a temperature of the chamber is about 100° C. to about 180° C.

10. The method of claim 9, wherein the pressure of the chamber is about 2.5 Torr and the distance between the first and second electrodes is about 2.0 cm.

11. The method of claim 10, wherein the percentage of $SiH_4$ to $H_2$ to be supplied to the gas supply unit has a value of about 3% by volume.

12. A method of fabricating a liquid crystal display, the method comprising:
   providing first and second substrates facing each other;
   forming a thin film transistor comprising a semiconductor layer having an amorphous silicon layer on the first substrate or the second substrate by using chemical vapor deposition equipment, in which a ratio of Si—H bonding to Si—$H_2$ bonding in the amorphous silicon layer has a value equal to or less than 4 to 1; and
   forming a liquid crystal layer between the first and second substrates,
   wherein the chemical vapor deposition equipment comprises:
   a chamber;
   first and second electrodes in the chamber, the first and second electrodes facing each other;
   a gas supply to supply $SiH_4$ and $H_7$ to the chamber; and
   a power supply to apply power to the first and second electrodes, and
   wherein a pressure of the chamber is about 1.6 Torr to about 3.5 Torr, a $SiH_4$ to $H_2$ to be supplied to the gas supply unit is about 1% by volume to about 4% by volume, the power is about 150 W to about 500 W, a distance between the first and second electrodes is about 1.3 cm to about 2.5 cm, and a temperature of the chamber is about 100° C. to about 180° C.

13. The method of claim 12, wherein the ratio of Si—H bonding to Si—$H_2$ bonding has a value equal to or greater than 1.2 to 1 and equal to or less than 3.6 to 1.

14. The method of claim 12, wherein the pressure of the chamber is about 2.5 Torr.

15. The method of claim 12, wherein the percentage of $SiH_4$ to $H_2$ to be supplied to the gas supply unit has a value of about 3%.

16. The method of claim 12, wherein the power is about 150 W.

17. The method of claim 12, wherein the distance between the first and second electrodes is about 2.0 cm.

18. The method of claim 12, wherein the temperature in the chamber is about 130° C.

* * * * *